(12) United States Patent
Teraki

(10) Patent No.: US 8,536,439 B2  
(45) Date of Patent: Sep. 17, 2013

(54) THERMOELECTRIC DEVICE

(75) Inventor: Junichi Teraki, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 434 days.

(21) Appl. No.: 12/810,650

(22) PCT Filed: Dec. 18, 2008

(86) PCT No.: PCT/JP2008/003844  
§ 371 (c)(1),  
(2), (4) Date: Jun. 25, 2010

(87) PCT Pub. No.: WO2009/084172  
PCT Pub. Date: Jul. 9, 2009

(65) Prior Publication Data  
US 2010/0263700 A1     Oct. 21, 2010

(30) Foreign Application Priority Data  
Dec. 27, 2007 (JP) ................. 2007-336128

(51) Int. Cl.  
H01L 35/00 (2006.01)  
H01L 37/00 (2006.01)  
H01L 35/28 (2006.01)

(52) U.S. Cl.  
USPC ............... 136/203; 136/200; 136/225

(58) Field of Classification Search  
USPC .................. 136/200, 225, 230, 233, 203  
See application file for complete search history.

(56) References Cited

U.S. PATENT DOCUMENTS

| 3,981,751 A * | 9/1976 | Dashevsky et al. ........... 136/225 |
| 7,317,159 B2 | 1/2008 | Adachi et al. |
| 2006/0162761 A1* | 7/2006 | Tanielian ................... 136/205 |

FOREIGN PATENT DOCUMENTS

| JE | 7-111345 A | 4/1995 |
| JP | H02-026387 U | 2/1990 |
| JP | 02-288376 A | 11/1990 |
| JP | 6-29581 A | 2/1994 |
| JP | 6-188464 A | 4/1994 |
| JP | 8-236819 A | 9/1996 |
| JP | 8-288559 A | 11/1996 |
| JP | 10-173110 A | 6/1998 |
| JP | 2004-253426 A | 9/2004 |
| JP | 2006-186255 A | 7/2006 |

* cited by examiner

*Primary Examiner* — Jonathan Johnson  
*Assistant Examiner* — Lindsey Bernier  
(74) *Attorney, Agent, or Firm* — Birch, Stewart, Kolasch & Birch, LLP.

(57) ABSTRACT

A thermoelectric device including a first insulating substrate (A) and a second insulating substrate (B) stacked on each other. Including a first electrode (2b) formed on the upper surface of the first insulating substrate (A), a pair of second electrodes (3c, 4c) individually formed on opposite surfaces thereof and connected to each other via a through-hole (7), and a thermoelectric material (5b) provided in the form of a thin film so as to contact the first electrode (2b) and the second electrode (3c). Furthermore, including a pair of third electrodes (8b, 9b) formed on opposite surfaces of the second insulating substrate (B) and connected to each other via a through-hole (10) while one of the third electrodes (8b, 9b) is connected to the first electrode (2b).

9 Claims, 8 Drawing Sheets

THERMOELECTRIC DEVICE

TECHNICAL FIELD

The present invention relates to a thermoelectric device using a thin film thermoelectric material.

BACKGROUND ART

In recent years, although a high-performance thermoelectric material in which a superlattice structure is utilized has been developed, the material is generally capable of being manufactured only in the form of a thin film (10 nm to 10 μm) on a substrate, resulting in difficulty in being produced as a thermoelectric module commonly used. Such difficulty is caused for the reason that manufacture of a thermoelectric module requires a thermoelectric material of approximately 1 mm square.

CITATION LIST

Patent Documents

Patent Document 1: Japanese Patent Application Publication No. H06-29581
Patent Document 2: Japanese Patent Application Publication No. H06-188464
Patent Document 3: Japanese Patent Application Publication No. H10-173110
Patent Document 4: Japanese Patent Application Publication No. 2004-253426

SUMMARY OF THE INVENTION

Technical Problem

Although a thermoelectric module using a thin film thermoelectric material is also proposed, such a module has problems including incapability of increasing a temperature difference, inefficiency due to a great heat loss by a substrate, small heat absorption, inconvenience to use, and difficulty in manufacture. Another problem is that, when a bending force acts on a thermoelectric module, resulting in a tensile stress and a compression stress which act on a thermoelectric material, the thermoelectric material easily breaks due to being a thin film.

Solution to the Problem

A first aspect includes: a first insulating substrate (A) and a second insulating substrate (B) to be stacked each other; a first electrode (2b) formed on a surface of the first insulating substrate (A) facing the second insulating substrate (B); a pair of second electrodes (3c, 4c) which are individually formed on the both surfaces of the first insulating substrate (A) so as to be spaced apart from the first electrode (2b), the second electrodes (3c, 4c) being connected to each other via a through-hole (7) extending in a thickness direction of the first insulating substrate (A); a first conductive thermoelectric material (5b) provided in the form of a thin film on a surface of the first insulating substrate (A) facing the second insulating substrate (B), the first conductive thermoelectric material (5b) contacting with the first electrode (2b) and the second electrode (3c); and a pair of the third electrodes (8b, 9b) which are individually formed on the both sides of the second insulating substrate (B), the third electrodes (8b, 9b) being connected to each other via a through-hole (10) extending in a thickness direction of the second insulating substrate (B) while one of the third electrodes (8b, 9b) is connected to the first electrode (2b) on the first insulating substrate (A).

In the above aspect, in cases where an electric current is applied between the first electrode (2b) and the second electrode (3c) [namely, the second electrode (3c) on a side of the second insulating substrate (B)], heat absorption and dissipation occur owing to the Peltier effect at an interface between the first electrode (2b) and the first conductive thermoelectric material (5b), and at an interface between the second electrode (3c) and the first conductive thermoelectric material (5b), respectively. That is, a temperature difference is generated at the both ends of the first conductive thermoelectric material (5b) in response to the above result. Accordingly, for example, the first electrode (2b) comes to be a heat-absorbing electrode, and the second electrode (3c) comes to be a heat-dissipating electrode. Furthermore, because the second electrode (3c) formed on a surface of the first insulating substrate (A) facing the second insulating substrate (B) is connected to the second electrode (4c) formed on another surface thereof via the through-hole (7), the second electrode (4c) also comes to be a heat-dissipating electrode.

On the other hand, because the third electrode (8b) formed on a surface of the second insulating substrate (B) facing the first insulating substrate (A) is connected to the first electrode (2b), the third electrode (8b) comes to be a heat-absorbing electrode. Furthermore, because the third electrode (8b) formed on a surface of the second insulating substrate (B) facing the first insulating substrate (A) is connected to the third electrode (9b) formed on another surface thereof via the through-hole (10), the third electrode (9b) also comes to be a heat-absorbing electrode.

Consequently, a thermoelectric module in which heat is released from one surface of the first insulating substrate (A) and is absorbed from one surface of the second insulating substrate (B) is produced. In other words, heat absorption and heat generation individually occur on surfaces of the first insulating substrate (A) and the second insulating substrate (B) except surfaces facing each other. The thermoelectric material (5b) is provided in the form of a thin film only between the first insulating substrate (A) and the second insulating substrate (B) in this manner, leading to being easily manufactured. Furthermore, because an electric current is applied to the thermoelectric material (5b) in an in-plane direction to generate a temperature difference, a distance from a low temperature side to a high temperature side is increased, so that the temperature difference is increased. Moreover, because the thermoelectric material (5b) is disposed between the first insulating substrate (A) and the second insulating substrate (B), a tensile stress and a compression stress that act on the thermoelectric material (5b) is decreased even when a bending force acts on a thermoelectric device, relative to the case where the thermoelectric material is disposed on a surface.

A second aspect includes: in the first aspect, a forth electrode (2c) formed on a surface of the first insulating substrate (A) facing the second insulating substrate (B), the fourth electrode (2c) being spaced apart from the first electrode (2b) and the second electrode (3c); a second conductive thermoelectric material (6c) provided in the form of a thin film on a surface of the first insulating substrate (A) facing the second insulating substrate (B), the second conductive thermoelectric material (6c) contacting with the second electrode (3c) and the fourth electrode (2c); and a pair of fifth electrodes (8c, 9c) individually formed on the both surfaces of the second insulating substrate (B), the fifth electrodes (8c, 9c) being connected to each other via the through-hole (10) extending in a thickness direction of the second insulating substrate (B) while one of the fifth electrodes (8c, 9c) is connected to the fourth electrode (2c) on the first insulating substrate (A).

In the above aspect, an electric current is applied between the first electrode (2b) and the fourth electrode (2c), so that heat is absorbed and generated owing to the Peltier effect at an interface between the first electrode (2b) and the first conductive thermoelectric material (5b), at an interface between the fourth electrode (2c) and the second conductive thermoelectric material (6c), at an interface between the second electrode (3c) and the first conductive thermoelectric material (5b), and at an interface between the second electrode (3c) and the second conductive thermoelectric material (6c). Namely, a temperature difference is generated at the both ends of each of the conductive thermoelectric materials (5b,6c) in response to the above result. Accordingly, for example, the first electrode (2b) and the fourth electrode (2c) come to be heat-absorbing electrodes, and the second electrode (3c) comes to be a heat-dissipating electrode. Furthermore, the second electrode (4c) formed on a surface of the first insulating substrate (A) on an opposite side of the second insulating substrate (B) comes to be a heat-dissipating electrode, and the third electrode (9b) and the fifth electrode (9c) formed on a surface of the second insulating substrate (B) on an opposite side of the first insulating substrate (A) come to be heat-absorbing electrodes. Consequently, a thermoelectric module in which heat is released from one surface of the first insulating substrate (A) and is absorbed from one surface of the second insulating substrate (B) is produced.

A third aspect of the invention includes: in the first aspect, a pair of fourth electrodes (3b, 4b) which are individually formed on the both surfaces of the first insulating substrate (A) so as to be spaced apart from the first electrode (2b) and the second electrodes (3c, 4c), the fourth electrodes (3b, 4b) being connected to each other via the through-hole (7) extending in a thickness direction of the first insulating substrate (A); and a second conductive thermoelectric material (6b) provided in the form of a thin film on a surface of the first insulating substrate (A) facing the second insulating substrate (B), the second conductive thermoelectric material (6b) contacting with the first electrode (2b) and the fourth electrodes (3b, 4b).

In the above aspect, an electric current is applied between the second electrode (3c) [namely, the second electrode (3c) on the side of the second insulating substrate (B)] and the fourth electrode (3b) [namely, the fourth electrode (3b) on the side of the second insulating substrate (B)], so that heat is absorbed and generated owing to the Peltier effect at an interface between the first electrode (2b) and the first conductive thermoelectric material (5b), at an interface between the first electrode (2b) and the second conductive thermoelectric material (6b), at an interface between the second electrode (3c) and the first conductive thermoelectric material (5b), and at an interface between the fourth electrode (3b) and the second conductive thermoelectric material (6b). In other words, a temperature difference is generated at the both ends of each of the thermoelectric materials (5b, 6b) in response to the above result. Accordingly, for example, the first electrode (2b) and the fourth electrode (2c) come to be heat-absorbing electrodes, and the second electrode (3c) comes to be a heat-dissipating electrode. Furthermore, the second electrode (4c) and the fourth electrode (4b) formed on a surface of the first insulating substrate (A) on an opposite side of the second insulating substrate (B) come to be heat-dissipating electrodes, and the third electrode (9b) formed on a surface of the second insulating substrate (B) on an opposite side of the first insulating substrate (A) comes to be a heat-absorbing electrode. Consequently, a thermoelectric module in which heat is released from one surface of the first insulating substrate (A) and is absorbed from one surface of the second insulating substrate (B) is produced.

According to a fourth aspect, in the first aspect, the width of a connection between the first conductive thermoelectric material (5b) and each of the first electrode (2b) and the second electrode (3c) is larger than the thickness of the first conductive thermoelectric material (5b).

In the above aspect, electrical resistance and thermal resistance in the connection are decreased. By virtue of this advantage, peripheral current density and thermal density are decreased, leading to a decreased loss.

According to a fifth aspect, in the first aspect, the thickness of each of the first electrode (2b) and the second electrode (3c) is larger than that of the first conductive thermoelectric material (5b), the second electrode (3c) being disposed so as to face the second insulating substrate (B).

In the above aspect, electrical resistance and thermal resistance in the connection are decreased. By virtue of this advantage, peripheral current density and thermal density are decreased, leading to a reduced loss.

According to a sixth aspect, in the first aspect, the first insulating substrate (A) at least partly includes a heat insulating section (18) under the first conductive thermoelectric material (5b).

In the above aspect, a heat loss in the first insulating substrate (A) is decreased, leading to improved performance.

According to a seventh aspect, in the first aspect, the first conductive thermoelectric material (5b) is formed at a stepped portion between the first insulating substrate (A) and each of the first electrode (2b) and the second electrode (3c), the second electrode (3c) being disposed so as to face the second insulating substrate (B).

In the above aspect, the first insulating substrate (A) and the upper surfaces of the electrodes (2b, 3c) are not required to be formed in the same plane, leading to the first insulating substrate (A) being easily manufactured.

According to an eight aspect, in the first aspect, each of the first electrode (2b) and the second electrode (3c) are formed so as to cover a stepped portion between the first conductive thermoelectric material (5b) and the first insulating substrate (A), the second electrode (3c) being disposed so as to face the second insulating substrate (B).

In the above aspect, the first insulating substrate (A) and the upper surfaces of the electrodes (2b, 3c) are not required to be formed in the same plane, leading to the first insulating substrate (A) being easily manufactured.

According to a ninth aspect, in the first aspect, the first insulating substrate (A) and the second insulating substrate (B) respectively include base substrates (A1, B1) and thermally-insulating substrates (A2, B2), which are respectively laminated.

In the above aspect, because the base substrates (A1, B1) having high toughness and the thermally-insulating substrates (A2, B2) having high thermal insulation properties are respectively laminated to produce the insulating substrates (A, B), both of thermal insulation properties and rigidity/toughness are improved.

Advantages of the Invention

As described above, according to an aspect of the invention, the second electrodes (3c, 4c) which are connected to each other via the through-hole (7) are individually formed on the both surfaces of the first insulating substrate (A), and the third electrodes (8b, 9b) which are connected to each other via the through-hole (10) are individually formed on the both surfaces of the second insulating substrate (B), and the thermoelectric material (5b) are provided in the form of a thin film between the stack of the insulating substrates (A, B). Accordingly, a thermoelectric module, in which heat is absorbed from one surface and is released from another surface, is capable of being produced. Such a module is of the type the same as typical thermoelectric modules, and it is therefore easy to use. Furthermore, the thermoelectric material (5b) is provided in the form of a thin film only between the insulating substrates (A, B), leading to being easily manufactured. Moreover, the thermoelectric material (5b) is disposed between the insulating substrates (A, B), in other words, the thermoelectric material (5b) is configured to be interposed between the insulating substrates (A, B), so that a tensile stress and a compression stress acting on the thermoelectric material (5b) can be reduced even when a bending force acts on a thermoelectric device. This prevents the thermoelectric material (5b) from being broken, thereby improving reliability. In addition, because an electric current is applied to the thermoelectric material (5b) in an in-plane direction to generate a temperature difference, a distance from a low temperature side to a high temperature side is capable of being increased. Accordingly, the temperature difference is capable of being configured to be large, and therefore a high-performance thermoelectric module is capable of being provided.

Furthermore, according to the second aspect, the second electrodes (3c, 4c) which are connected to each other via the through-hole (7) are individually formed on the both surfaces of the first insulating substrate (A), and the third electrodes (8b, 9b) which are connected to each other via the through-holes (10) and the fifth electrodes (8c, 9c) which are connected to each other via the through-holes (10) are individually formed on the both surfaces of the second insulating substrate (B), and the thermoelectric material (5b) are provided in the form of a thin film between the stack of the insulating substrates (A, B). Accordingly, a thermoelectric module, in which heat is absorbed from one surface and is released from another surface, is capable of being produced. In addition, as described above, a thermoelectric module which is easily manufactured and has high performance and reliability is capable of being provided.

Furthermore, according to the third aspect, the second electrodes (3c and 4c) which are connected to each other via the through-hole (7) and the fourth electrodes (3b and 4b) which are connected to each other via the through-hole (7) are individually formed on the both surfaces of the first insulating substrate (A), and the third electrodes (8b and 9b) which are connected to each other via the through-hole (10) are individually formed on the both surfaces of the second insulating substrate (B), and the thermoelectric material (5b) are provided in the form of a thin film between the stack of the insulating substrates (A and B). Accordingly, a thermoelectric module in which heat is absorbed from one surface and is released from another surface is capable of being produced. In addition, as described above, a thermoelectric module which is easily manufactured and has high performance and reliability is capable of being provided.

Furthermore, according to the fourth and fifth aspects, electrical resistance and thermal resistance in the connection are decreased, and peripheral current density and thermal density are also decreased, so that a loss is decreased, leading to improved performance.

Furthermore, according to the sixth aspect, a heat loss in the first insulating substrate (A) is capable of being decreased, leading to improved performance.

Furthermore, according to the seventh and eighth aspects, the upper surface of each of the first insulating substrate (A) and the electrodes (2b and 3c) is not required to be positioned in the same plane, leading to being easily manufactured.

Furthermore, according to the ninth aspect, each of the insulating substrates (A and B) has a laminate structure respectively including the base substrates (A1 and B1) and the thermally-insulating substrates (A2 and B2), leading to being able to satisfy both of thermal insulation properties and rigidity/toughness.

DESCRIPTION OF REFERENCE CHARACTERS

Figure 1:
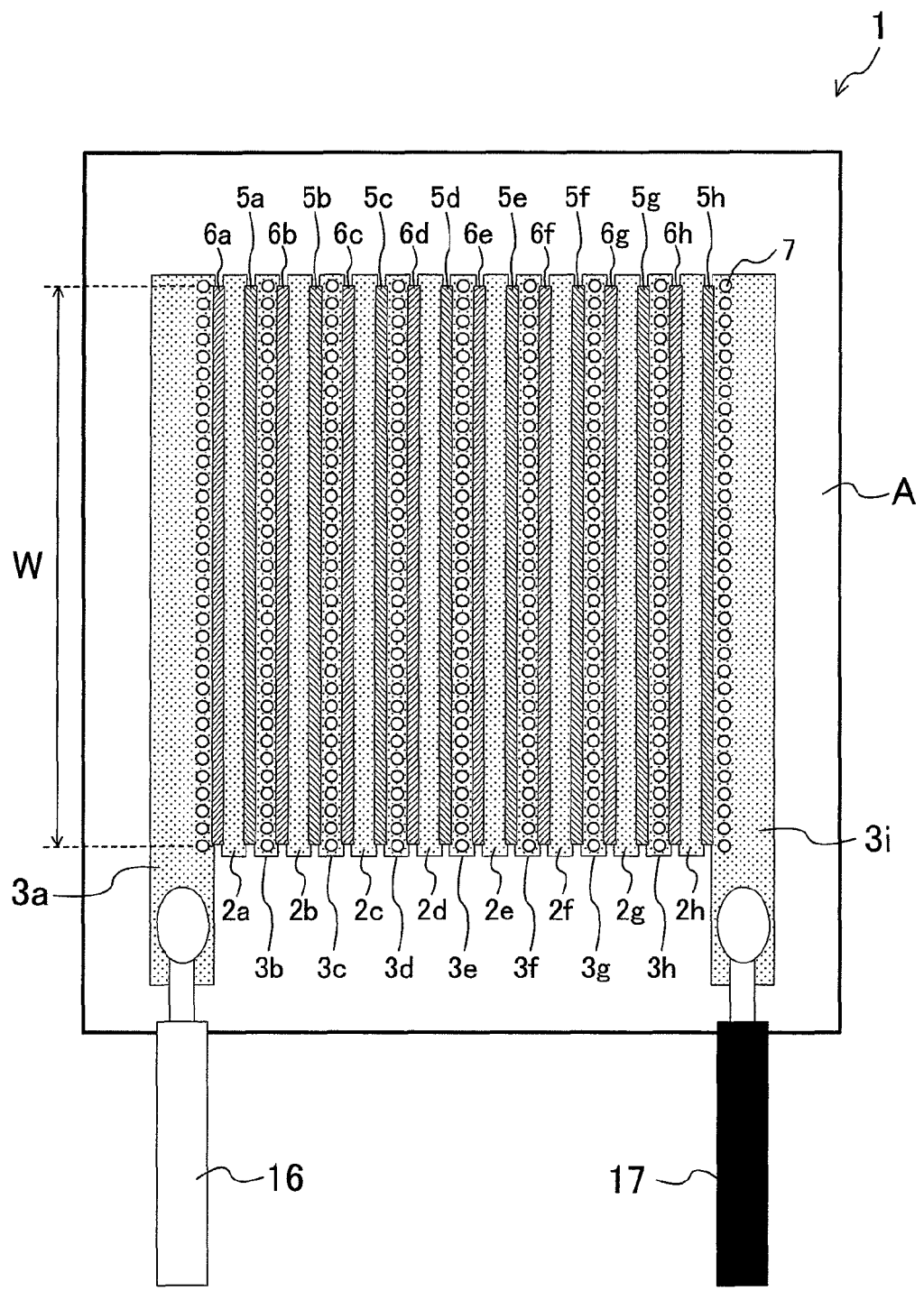
FIG. 1 is a cross-sectional view illustrating a thermoelectric module according to a first embodiment between insulating substrates.

1 Thermoelectric module (thermoelectric device)
A First insulating substrate
B Second insulating substrate
A1, B1 Base substrate
A2, B2 Thermally-insulating substrate
2a to 2h Heat-absorbing electrode
3a to 3i Heat-dissipating electrode
4a to 4i Heat-dissipating electrode
5a to 5h p-type thermoelectric material (first conductive thermoelectric material)
6a to 6h n-type thermoelectric material (second conductive thermoelectric material)
7, 10 Through-hole
8a to 8i Heat-absorbing electrode
9a to 9i Heat-absorbing electrode
18 Thermally insulating section

DESCRIPTION OF EMBODIMENTS

Embodiments of the invention will be hereinafter described in detail with reference to the accompanying drawings. Substantially identical portions in the drawings are denoted by the same reference characters, and will not be repeatedly described. The embodiments below are substantially preferred examples and are not intended to limit the scope, the application, and the use of the invention.

First Embodiment

A first embodiment of the invention will be described with reference to FIGS. 1 to 3. A thermoelectric module (1) of the first embodiment forms a thermoelectric device according to an aspect of the invention and has a stack of a first insulating substrate (A) and a second insulating substrate (B).

A plurality of heat-absorbing electrodes (2a to 2h), heat-dissipating electrodes (3a to 3i), p-type thermoelectric materials (5a to 5h), and n-type thermoelectric materials (6a to 6h) are provided in the form of strips on the upper surface of the first insulating substrate (A) (see, FIG. 1). These are disposed in order of the heat-dissipating electrode (3a), the n-type thermoelectric material (6a), the heat-absorbing electrode (2a), the p-type thermoelectric material (5a), the heat-dissipating electrode (3b) . . . the p-type thermoelectric material (5h), and the heat-dissipating electrode (3i). Each of the heat-dissipating electrodes (3a and 3i) disposed at the both ends is respectively connected to electrical wires (16 and 17). The individual p-type thermoelectric materials (5a to 5h) and n-type thermoelectric materials (6a to 6h) are provided in the form of thin films by a technique, such as vapor deposition, so as to be in contact with the electrodes (2a to 2h and 3a to 3i) being at the both adjacent sides thereof.

Figure 2:
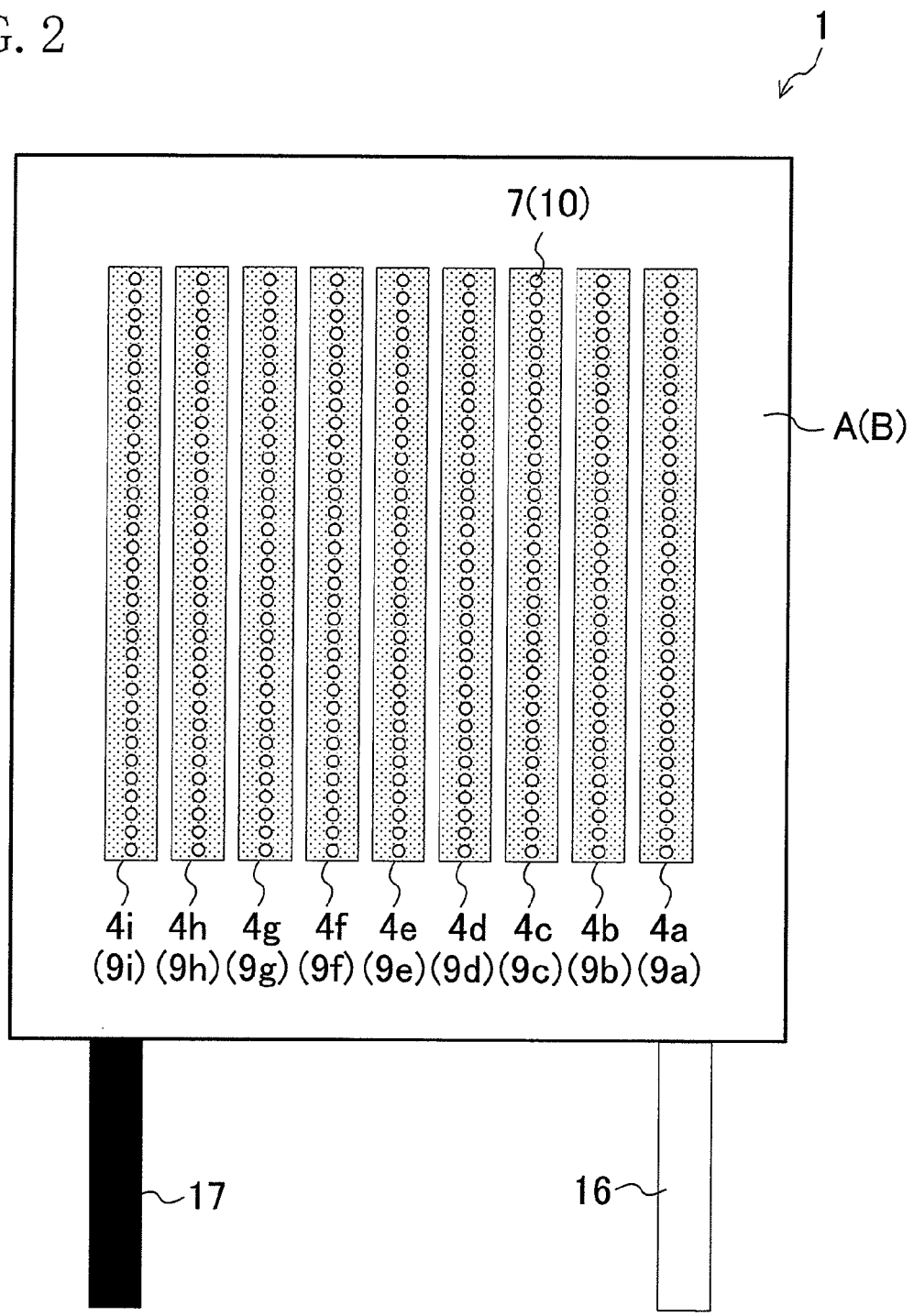
FIG. 2 is a plane view illustrating the thermoelectric module according to the first embodiment.

A plurality of heat-dissipating electrodes (4a to 4i) are provided in the form of strips on the lower surface of the first insulating substrate (A) (see, FIG. 2). Each of the heat-dissipating electrodes (3a to 3i) formed on the upper surface of the first insulating substrate (A) is connected to the corresponding heat-dissipating electrode (4a to 4i) formed on the lower surface of the first insulating substrate (A) via through-hole (7). The through-hole (7) is formed by, for example, preliminarily forming a hole on the substrate (A) and filling the hole with paste.

The heat-absorbing electrodes (2a to 2h) form first electrodes and fourth electrodes according to an aspect of the invention. The heat-dissipating electrodes (3a to 3i) and the heat-dissipating electrodes (4a to 4i) form second electrodes and the fourth electrodes according to an aspect of the invention. The p-type thermoelectric materials (5a to 5h) and the n-type thermoelectric materials (6a to 6h) respectively form first conductive thermoelectric materials and second conductive thermoelectric materials according to an aspect of the invention.

Figure 3:
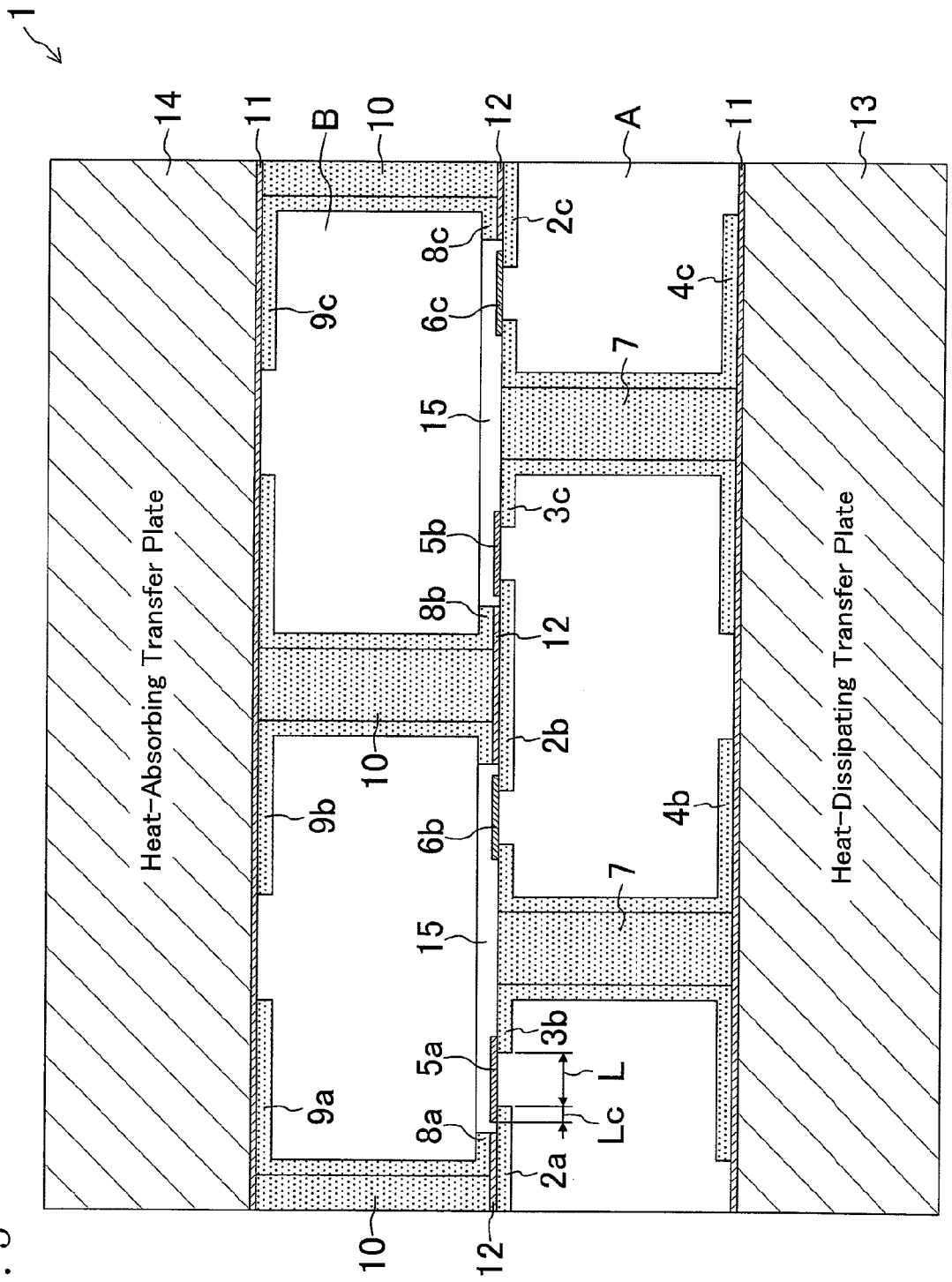
FIG. 3 is a vertical cross-sectional view illustrating the thermoelectric module according to the first embodiment.

On the other hand, a plurality of heat-absorbing electrodes (8a to 8i) are provided in the form of strips on the lower surface of the second insulating substrate (B), and a plurality of heat-absorbing electrodes (9a to 9i) are provided in the form of strips on the upper surface thereof (see, FIGS. 2 and 3). Each of the heat-absorbing electrodes (9a to 9i) formed on the upper surface of the second insulating substrate (B) is connected to the corresponding heat-absorbing electrode (8a to 8i) formed on the lower surface of the second insulating substrate (B) via a through-hole (10). The through-hole (10) is formed by, for example, preliminarily forming a hole on the substrate (B) and filling the hole with paste. Furthermore, the heat-absorbing electrodes (8a to 8i) formed on the lower surface of the second insulating substrate (B) are connected to the heat-absorbing electrodes (2a to 2h) formed on the upper surface of the first insulating substrate (A) through a connection layer (12). The connection layer (12) requires heat transfer properties, and it may be an electrically-conductive material, such as solder, as well as a thermally-conductive adhesion not having an electrical conductivity. In cases where the material not having electrical conductivity is used, an electric current does not flow in each of the heat-absorbing electrodes (8a to 8i and 9a to 9i) and the through-holes (10) of the substrate (B), and only heat flows therein. The heat-absorbing electrodes (8a to 8i) and the heat-absorbing electrodes (9a to 9i) respectively form third electrodes and fifth electrodes according to an aspect of the invention.

Preferably, each of the substrates (A and B) has insulation properties and high thermal insulation properties. By virtue of this configuration, heat leakage from a heat release side (high temperature side) to a heat absorption side (low temperature side) is prevented. Examples of the material of the substrate (A) include glass, resin, or resin foam.

Preferably, each of the electrodes (2a to 2h, 3a to 3i, 4a to 4i, 8a to 8i, and 9a to 9i) is produced with a material having low electric resistance and high thermal-conductivity (for example, copper or aluminum). Furthermore, preferably, in order for good connection to each of the thermoelectric materials (5a to 5h and 6a to 6h), and in order to improve durability, each of the electrodes (2a to 2h, 3a to 3i, 4a to 4i, 8a to 8i, and 9a to 9i) is plated with nickel or gold.

With reference to FIG. 3, an exothermic heat transfer plate (13) is disposed under the lower surface of the first insulating substrate (A) with interposing an insulating layer (11) therebetween. An endothermic heat transfer plate (14) is disposed over the upper surface of the second insulating substrate (B) with interposing the insulating layer (11) therebetween. By virtue of this configuration, heat is uniformized and is flowed from the upper surface of the module to the lower surface, and therefore such a module is capable of being used in a manner the same as typical thermoelectric modules, leading to being easily used. Furthermore, groove-like spaces (15) are provided on the lower surface of the second insulating substrate (B) to prevent heat transfer between each of the thermoelectric materials (5a to 5h and 6a to 6h) and each of the heat-dissipating electrodes (3a to 3i).

In the thermoelectric module (1) of the embodiment, an electric current is applied between the heat-dissipating electrodes (3a and 3i) through the electrical wires (16 and 17) (see, FIG. 1), so that heat is absorbed at an interface between each of the heat-absorbing electrodes (2a to 2h) and the corresponding thermoelectric material (5a to 5h and 6a to 6h), and heat is released at an interface between each of the heat-dissipating electrodes (3a to 3i) and the corresponding thermoelectric material (5a to 5h and 6a to 6h). Consequently, a temperature difference is generated at the both ends of each of the thermoelectric materials (5a to 5h and 6a to 6h) in response to the above result. In the thermoelectric module (1) of the embodiment, each of the heat-dissipating electrodes (3a to 3i) formed on the upper surface of the first insulating substrate (A) is connected to the corresponding heat-dissipating electrode (4a to 4i) formed on the lower surface thereof via the corresponding through-hole (7), so that heat is released from the heat-dissipating electrodes (3a to 3i) formed on the lower surface and the exothermic heat transfer plate (13). Furthermore, in the thermoelectric module (1), because each of the heat-absorbing electrodes (8a to 8i) on the lower surface of the second insulating substrate (B) is connected to the corresponding heat-absorbing electrode (9a to 9i) on the upper surface thereof via the corresponding through-hole (10) and is connected to the corresponding heat-absorbing electrode (2a to 2h) on the upper surface of the first insulating substrate (A) through the connection layer (12), heat is absorbed from the heat-absorbing electrodes (9a to 9i) on the upper surface of the second insulating substrate (B) and the endothermic heat transfer plate (14). Such a module is of the type the same as typical thermoelectric modules, and it is therefore easy to use.

Effect of the Embodiment 1

According to the above embodiment, the thermoelectric materials (5a to 5h and 6a to 6h) are formed only between the first insulating substrate (A) and the second insulating substrate (B), in other words only on the upper surface of the first insulating substrate (A), so that the substrates (A and B) are not required to be reversed in manufacturing processes, leading to being easily manufactured.

The thermoelectric materials (5a to 5h and 6a to 6h) are disposed between the first insulating substrate (A) and the second insulating substrate (B), in other words the thermoelectric materials (5a to 5h and 6a to 6h) are interposed between the substrates (A and B), and therefore, even when a bending force acts on a surface of the thermoelectric module (1), the bending force that acts on the thermoelectric materials (5a to 5h and 6a to 6h) is capable of being decreased, relative to the case where thermoelectric materials are disposed on an edge face of the thermoelectric module. Accordingly, collapse of the thermoelectric materials (5a to 5h and 6a to 6h) is capable of being precluded, and the thermoelectric module (1) having high reliability is capable of being provided.

The thermoelectric materials (5a to 5h and 6a to 6h) are disposed between the substrates (A and B), and thereby precluding the mixture of high temperature portions and low temperature portions on the upper and lower surfaces of the thermoelectric module (1). Accordingly, the thermoelectric module (1) being easy to use is capable of being provided.

Furthermore, because an electric current is applied to the thin film thermoelectric materials (5a to 5h and 6a to 6h) in an in-plane direction to generate a temperature difference, a distance from a low temperature side to a high temperature side is increased, so that the temperature difference is capable of being configured to be large. Specifically, assuming that a thickness, a width, and a length of each of the thermoelectric materials (5a to 5h and 6a to 6h) are respectively t, W (see, FIG. 1), and L (see, FIG. 3) and that a length of a connection to each of the electrodes (2a to 2h and 3a to 3i) is Lc (see, FIG. 3), an electric current flows in an in-plane direction of the thin film with the result that a temperature difference is also generated in the in-plane direction, and the L is capable of being configured to be large in spite of thin film with the result that the temperature difference is able to be configured to be large. Furthermore, the W is configured to be extremely larger than the t (for example, approximately 1000 times), and the L is configured to be, for example, 10 times the t, so that a form factor (L/tW) of a device is capable of being configured to be equal to that of typical Peltier modules. Accordingly, properties (resistance, heat absorption, and efficiency) equal to those of the typical Peltier modules are capable of being obtained. Furthermore, the t is configured to be approximately 10 µm to form a thin film, and the W is configured to be extremely larger than the t (for example, approximately 1000 times), and the L is configured to be, for example, 10 times the t, so that volume (LtW) of a thermoelectric material is capable of being decreased to approximately hundredth part of that of a thermoelectric material used in the typical Peltier modules. Consequently, materials to be used are saved to significantly reduce costs, and environmental acceptability is drastically improved.

Preferably, in order to decrease the electrical resistance and thermal resistance of the connection between each of the electrodes (2a to 2h and 3a to 3i) and the corresponding thermoelectric material (5a to 5h and 6a to 6h), and in order to decrease peripheral electrical density and thermal density to reduce a loss, a connection surface is configured to be large (specifically, Lc>t). However, because an excessively large configuration leads to waste of materials, an optimum value exists. For a similar reason, preferably, the thickness of each of the electrodes (2a to 2h and 3a to 3i) is configured to be larger than that of each of the thermoelectric materials (5a to 5h and 6a to 6h).

Second Embodiment

Figure 4:
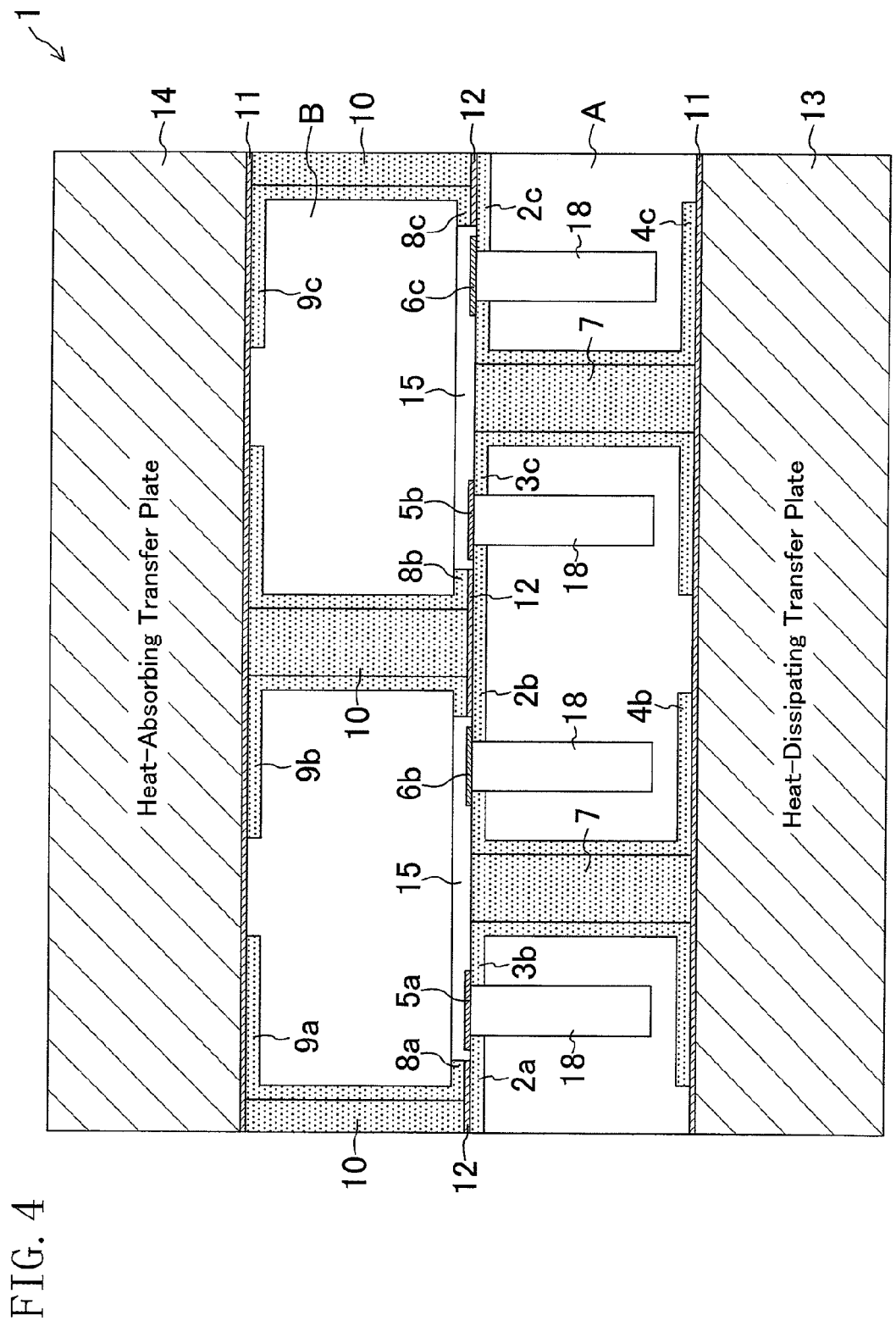
FIG. 4 is a vertical cross-sectional view illustrating a thermoelectric module according to a second embodiment.

A second embodiment of the invention will be described with reference to FIG. 4. A thermoelectric module (1) of the embodiment is a modification of the first embodiment.

In the thermoelectric module (1), the substrate (A) partly has heat insulating sections (18) which are each provided in the form of a slit under the corresponding thermoelectric material (5a to 5h and 6a to 6h). Accordingly, heat leakage is capable of being precluded to improve a function. Examples of a method for forming the heat insulating section (18) include removing materials or preparing porous structures only in the corresponding portions (15) in the substrate (A). For example, such a method includes preparing only the corresponding portions (18) of the substrate (A) with other materials (having low melting point), depositing the thermoelectric materials (5a to 5h and 6a to 6h), and then melting the corresponding portion (18) by heat treatment.

Third Embodiment

Figure 5:
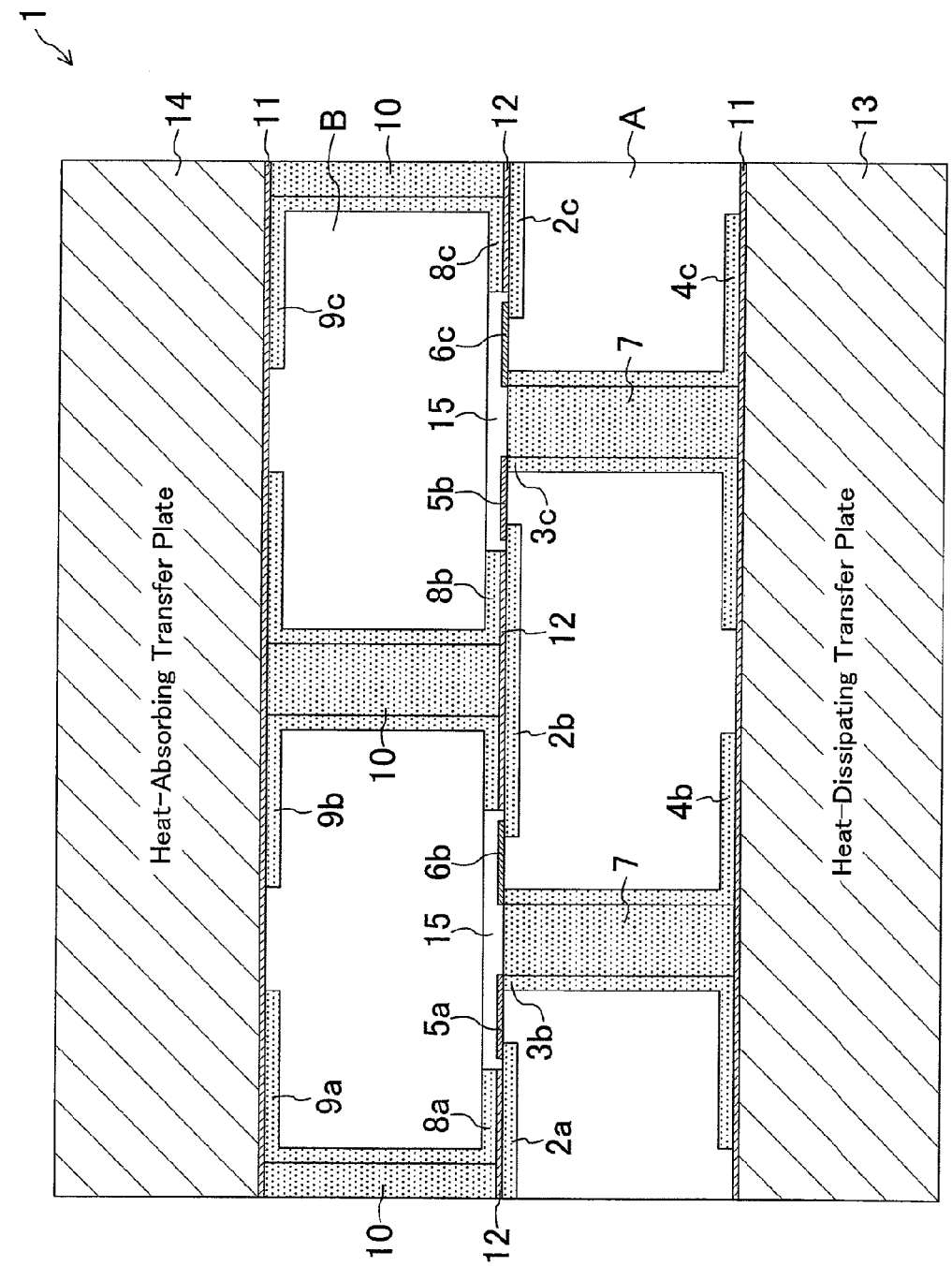
FIG. 5 is a vertical cross-sectional view illustrating a thermoelectric module according to a third embodiment.

A third embodiment of the invention will be described with reference to FIG. 5. A thermoelectric module (1) of the third embodiment is a modification of the first embodiment.

In the thermoelectric module (1), the surface area of each of the heat-absorbing electrodes (2a to 2h) formed on the upper surface of the substrate (A) is configured to be larger than that of each of the heat-dissipating electrodes (3a to 3i). Accordingly, an endothermic area on the upper surface of the first insulating substrate (A) is capable of being increased, and therefore endothermic areas on the upper and lower surfaces of the second insulating substrate (B) is capable of being increased. Consequently, thermal resistance in the endothermic side is capable of being decreased to improve a function. In addition, the surface area of each of the heat-dissipating electrodes (4a to 4i) formed on the lower surface of the first insulating substrate (A) is configured to be large, and thereby being able to decrease thermal resistance on the exothermic side, similarly.

Fourth Embodiment

Figure 6:
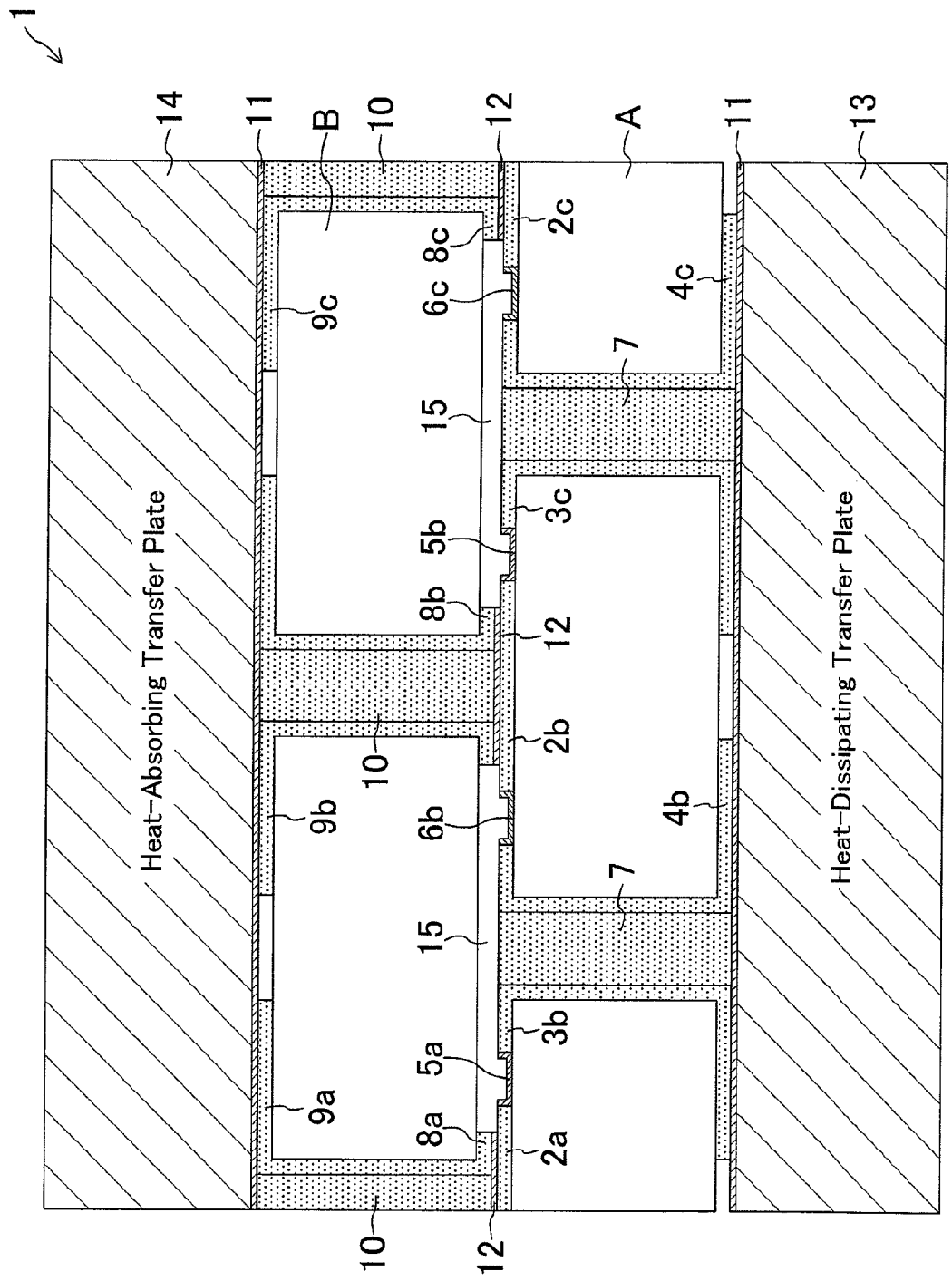
FIG. 6 is a vertical cross-sectional view illustrating a thermoelectric module according to a fourth embodiment.

A Fourth embodiment of the invention will be described with reference to FIG. 6. A thermoelectric module (1) of the fourth embodiment is a modification of the first embodiment.

In the thermoelectric module (1), each of the thermoelectric materials (5a to 5h and 6a to 6h) is formed between the corresponding electrodes (2a to 2h and 3a to 3i) [formed at stepped portions between the insulating substrate (A) and individual electrodes (2a to 2h and 3a to 3i)]. Consequently, each of the upper surfaces of the first insulating substrate (A) and the electrodes (2a to 2h and 3a to 3i) is not required to be formed in the same plane, so that the substrate (A) is easily manufactured [copper foil is plated on the substrate (A), thereby being able to be manufactured in a manner the same as typical printed substrates].

Fifth Embodiment

Figure 7:
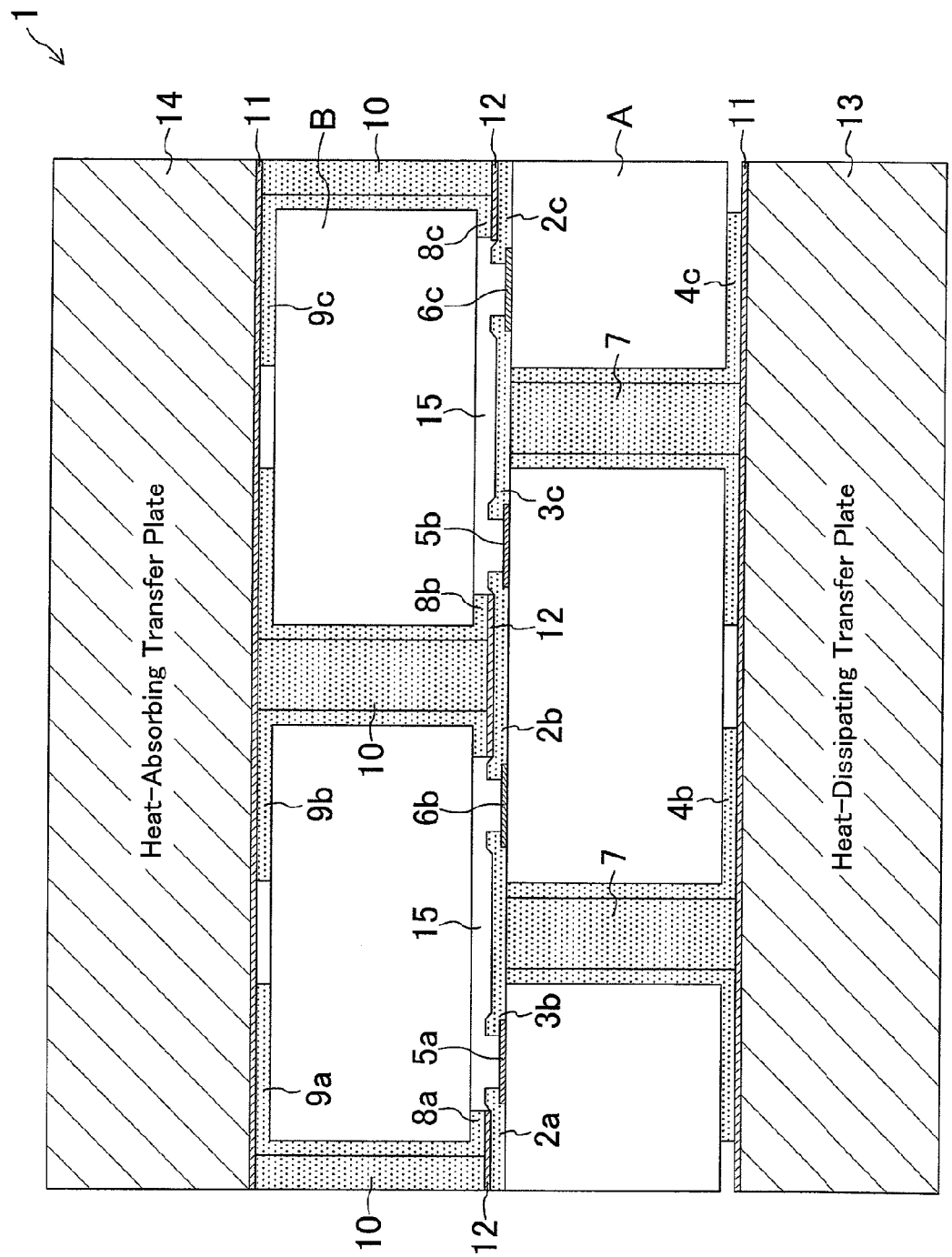
FIG. 7 is a vertical cross-sectional view illustrating a thermoelectric module according to a fifth embodiment.

A Fifth embodiment of the invention will be described with reference to FIG. 7. A thermoelectric module (1) of the fifth embodiment is a modification of the first embodiment.

In the thermoelectric module (1), each of the electrodes (2a to 2h and 3a to 3i) is formed on the corresponding thermoelectric material (5a to 5h and 6a to 6h) [formed so as to cover a stepped portion between the substrate (A) and individual thermoelectric materials (5a to 5h and 6a to 6h)]. Consequently, the upper surfaces of the first insulating substrate (A) and each of the electrodes (2a to 2h and 3a to 3i) are not required to be formed in the same plane, so that the substrate (A) is easily manufactured. A method for manufacturing such a thermoelectric module (1) includes initially forming only the through-holes (7) for the heat-dissipating electrodes (3a to 3i and 9a to 9i) in the substrate (A), depositing the thermoelectric materials (5a to 5h and 6a to 6h) on a surface of the substrate (A), and then forming the heat-dissipating electrodes (3a to 3i) and the heat-absorbing electrodes (2a to 2h) by, for example, vapor deposition.

Sixth Embodiment

Figure 8:
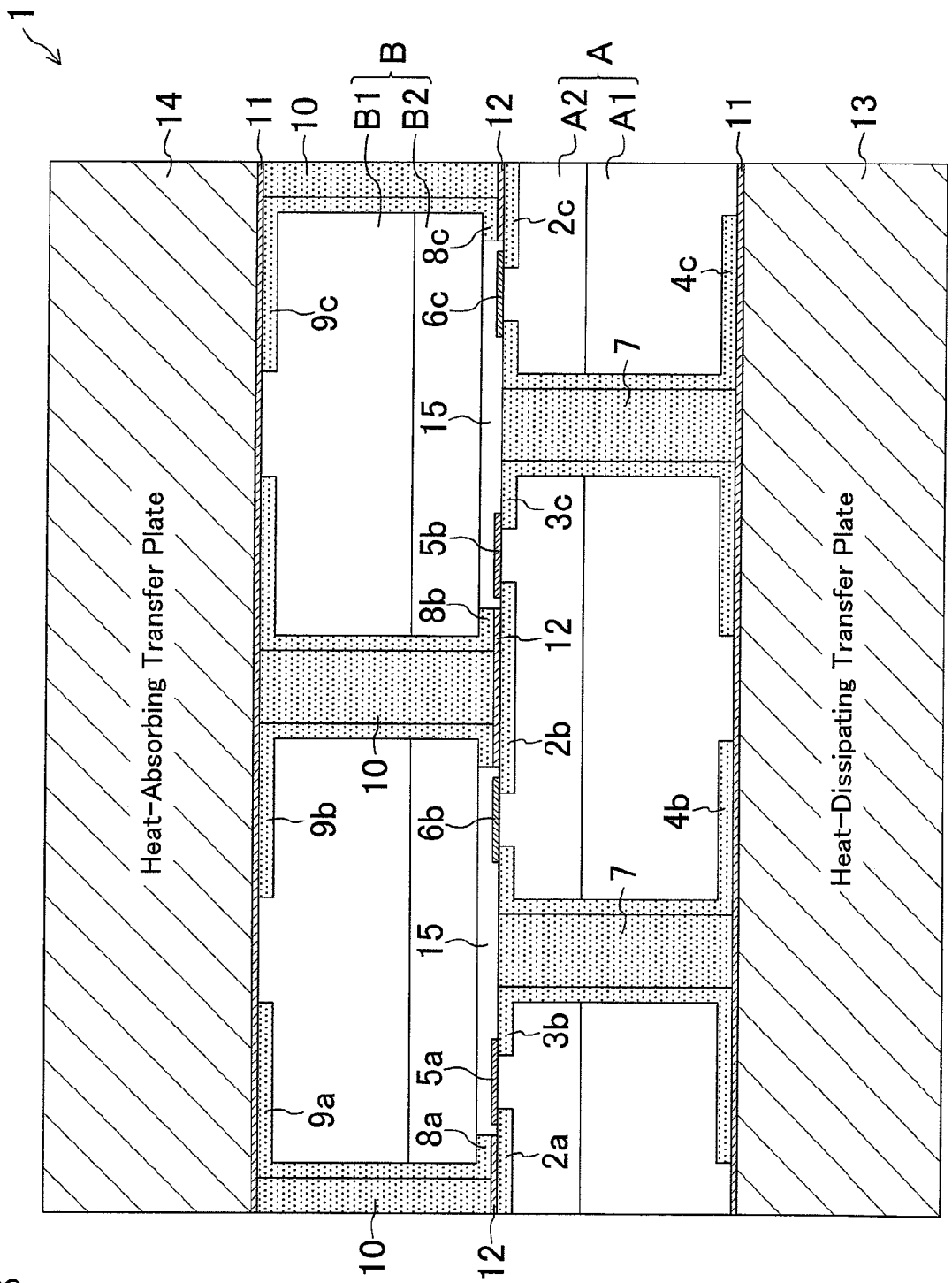
FIG. 8 is a vertical cross-sectional view illustrating a thermoelectric module according to a sixth embodiment.

A Sixth embodiment of the invention will be described with reference to FIG. 8. A thermoelectric module (1) of the sixth embodiment is a modification of the first embodiment.

In the thermoelectric module (1), each of the substrates (A, B) is a multilayer substrate respectively including base substrate (A1, B1) and thermally-insulating substrate (A2, B2). Namely, in the first insulating substrate (A), the upper side is the thermally-insulating substrate (A2), and the lower side is the base substrate (A1). In the second insulating substrate (B), the upper side is the base substrate (B1), and the lower side is the thermally-insulating substrate (B2). The reason of this configuration will be described below.

Desirably, a substrate used in the thermoelectric module (1) has high thermal insulation performance (low thermal conductivity) as much as possible. An effective method for decreasing the thermal conductivity is thought, in which the substrate is made to have porosity (foam). However, in order to decrease the thermal conductivity as much as possible, volume of a pore is required to be larger (foaming rates are required to be larger), and thereby decreasing rigidity and toughness appropriate for a substrate, resulting in difficulty in handling and incapability of obtaining toughness sufficient for a module. On the other hand, in cases where rigidity and toughness are increased, sufficient thermal insulation properties are not capable of being obtained, leading to decreasing performance of the module.

In the embodiment, the thermally-insulating substrates (A2 and B2) having high thermal insulation performance are respectively laminated on the base substrates (A1 and B1) having high toughness, and therefore both of thermal insulation properties and rigidity/toughness are capable of being satisfied, leading to being capable of manufacturing a module having high performance and high toughness. The thermally-insulating substrates (A2 and B2) are disposed on a side provided with the thermoelectric materials (5a to 5h and 6a to 6h) for the reason that a temperature difference is generated at this portion [a temperature difference is generated between each of the heat-dissipating electrodes (3a to 3i) and a corresponding heat-absorbing electrode (2a to 2h and 8a to 8i), and therefore in the case of the substrate having poor thermal insulation properties, heat flows back from each of the heat-dissipating electrodes (3a to 3i) to a corresponding heat-absorbing electrodes (2a to 2h and 8a to 8i), resulting in decreased performance], and therefore such a portion is required to be thermally insulated as much as possible. On the other hand, because the thermally-insulating substrates (A2 and B2) are respectively disposed between the base substrates (A1 and B2) and the heat-dissipating electrodes (2a to 2h and 8a to 8i), heat less flows back, and through-holes (7 and 10) are provided to be maintained at the same temperature with the result that heat is not transferred, and therefore performance is less decreased even if thermal insulation properties are low.

Other Embodiments

Although the thermoelectric module (1) according to an aspect of the invention is configured such that an endothermic side is the upper surface thereof [the upper surface of the second insulating substrate (B)] and such that an exothermic side is the lower surface thereof [the lower surface of the first insulating substrate (A)], it is not limited to such a configuration. The exothermic side may be configured so as to be disposed on the upper surface, and the endothermic side may be configured so as to be disposed on the lower surface.

In the thermoelectric module (1) according to an aspect of the invention, although a cooling module utilizing the Peltier effect has been described, it is not limited to such a configuration. In the same configuration, a load is connected instead of a power source, and a thermal input is externally imparted to an endothermic side, and heat is released from an exothermic side (temperature in the endothermic side comes to be higher than that in the exothermic side), and thereby being able to produce a power generation module utilizing Seebeck effect.

INDUSTRIAL APPLICABILITY

As described above, the invention is useful for a thermoelectric device in which an electric current is applied to the element to utilize Peltier effect with the result that a connection is cooled or heated.

The invention claimed is:

1. A thermoelectric device comprising:
a first insulating substrate and a second insulating substrate stacked on each other;
a first electrode formed on a surface of the first insulating substrate facing the second insulating substrate;
a pair of second electrodes individually formed on opposite surfaces of the first insulating substrate so as to be spaced apart from the first electrode, the second electrodes being connected to each other via a through-hole extending in a thickness direction of the first insulating substrate;
a first conductive thermoelectric material provided in the form of a thin film on a surface of the first insulating substrate facing the second insulating substrate, the first conductive thermoelectric material contacting the first electrode and the second electrode; and
a pair of third electrodes individually formed on opposite surfaces of the second insulating substrate, the third electrodes being connected to each other via a through-hole extending in a thickness direction of the second insulating substrate, one of the third electrodes being connected to the first electrode on the first insulating substrate.

2. The thermoelectric device according to claim 1, further comprising:
a fourth electrode formed on a surface of the first insulating substrate facing the second insulating substrate, the fourth electrode being spaced apart from the first electrode and the second electrode;
a second conductive thermoelectric material provided in the form of a thin film on a surface of the first insulating substrate facing the second insulating substrate, the second conductive thermoelectric material contacting the second electrode and the fourth electrode; and a pair of fifth electrodes individually formed on opposite surfaces of the second insulating substrate, the fifth electrodes being connected to each other via the through-hole extending in a thickness direction of the second insulating substrate, and one of the fifth electrodes being connected to the fourth electrode on the first insulating substrate.

3. The thermoelectric device according to claim 1, further comprising:

a pair of fourth electrodes individually formed on opposite surfaces of the first insulating substrate so as to be spaced apart from the first electrode and the second electrodes, the fourth electrodes being connected to each other via the through-hole extending in a thickness direction of the first insulating substrate; and a second conductive thermoelectric material provided in the form of a thin film on the surface of the first insulating substrate facing the second insulating substrate, the second conductive thermoelectric material contacting with the first electrode and the fourth electrodes.

4. The thermoelectric device according to claim 1, wherein the width of a connection between the first conductive thermoelectric material and each of the first electrode and the second electrode is larger than the thickness of the first conductive thermoelectric material.

5. The thermoelectric device according to claim 1, wherein the thickness of each of the first electrode and the second electrode is larger than that of the first conductive thermoelectric material, the second electrode being disposed so as to face the second insulating substrate.

6. The thermoelectric device according to claim 1, wherein the first insulating substrate at least partly includes a heat insulating section under the first conductive thermoelectric material.

7. The thermoelectric device according to claim 1, wherein the first conductive thermoelectric material is formed at a stepped portion between the first insulating substrate and each of the first electrode and the second electrode, the second electrode being disposed so as to face the second insulating substrate.

8. The thermoelectric device according to claim 1, wherein each of the first electrode and the second electrode are formed so as to cover a stepped portion between the first conductive thermoelectric material and the first insulating substrate, the second electrode being disposed so as to face the second insulating substrate.

9. The thermoelectric device according to claim 1, wherein the first insulating substrate and the second insulating substrate respectively include base substrates and thermally-insulating substrates, which are respectively laminated.

* * * * *